United States Patent
de Souza et al.

(10) Patent No.: US 10,032,870 B2
(45) Date of Patent: Jul. 24, 2018

(54) LOW DEFECT III-V SEMICONDUCTOR TEMPLATE ON POROUS SILICON

(71) Applicant: GLOBALFOUNDRIES INC., Grand Cayman (KY)

(72) Inventors: Joel P. de Souza, Putnam Valley, NY (US); Keith E. Fogel, Hopewell Junction, NY (US); Alexander Reznicek, Troy, NY (US); Dominic J. Schepis, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 33 days.

(21) Appl. No.: 14/645,449

(22) Filed: Mar. 12, 2015

(65) Prior Publication Data
US 2016/0268123 A1    Sep. 15, 2016

(51) Int. Cl.
*H01L 29/20* (2006.01)
*H01L 29/16* (2006.01)
*H01L 21/02* (2006.01)
*H01L 29/36* (2006.01)

(52) U.S. Cl.
CPC .......... *H01L 29/16* (2013.01); *H01L 21/0245* (2013.01); *H01L 21/02505* (2013.01); *H01L 21/02513* (2013.01); *H01L 21/02538* (2013.01); *H01L 21/02658* (2013.01); *H01L 29/36* (2013.01)

(58) Field of Classification Search
CPC .......... H01L 21/0254; H01L 21/02543; H01L 21/02546; H01L 21/02549; H01L 21/0245; H01L 29/16; H01L 29/36
USPC .......................................... 257/615
See application file for complete search history.

(56) References Cited

U.S. PATENT DOCUMENTS

| 4,806,996 | A |   | 2/1989 | Luryi |                              |
|-----------|---|---|--------|---------|----------------------------|
| 4,982,263 | A | * | 1/1991 | Spratt  | H01L 21/76264               |
|           |   |   |        |         | 148/33.2                    |
| 5,439,843 | A | * | 8/1995 | Sakaguchi | H01L 21/30604             |
|           |   |   |        |         | 257/E21.121                 |
| 5,950,094 | A | * | 9/1999 | Lin     | H01L 21/76245               |
|           |   |   |        |         | 148/DIG. 50                 |
| 6,106,613 | A | * | 8/2000 | Sato    | H01L 21/02381               |
|           |   |   |        |         | 117/104                     |
| 6,107,213 | A | * | 8/2000 | Tayanaka | H01L 21/02381              |
|           |   |   |        |         | 257/E21.216                 |

(Continued)

OTHER PUBLICATIONS

Zhang et al., "Porous Silicon: Morphology and Formation Mechanisms", Modern Aspects of Electrochemistry 39 (2005) pp. 65-133.*

(Continued)

*Primary Examiner* — Jay C Kim
(74) *Attorney, Agent, or Firm* — Yuanmin Cai; Hoffman Warnick LLC

(57) ABSTRACT

A method of forming a semiconductor on a porous semiconductor structure. The method may include forming a stack, the stack includes (from bottom to top) a substrate, a base silicon layer, a thick silicon layer, and a thin silicon layer, where the thin silicon layer and the thick silicon layer are relaxed; converting the thick silicon layer into a porous silicon layer using a porousification process; and forming a III-V layer on the thin silicon layer, where the III-V layer is relaxed, the thin silicon layer is strained, and the porous silicon layer is partially strained.

12 Claims, 3 Drawing Sheets

100

| 110 |
|-----|
| 108 |
| 116 |
| 104 |
| 102 |

(56) References Cited

U.S. PATENT DOCUMENTS

| | | | | |
|---|---|---|---|---|
| 6,143,628 | A * | 11/2000 | Sato | H01L 21/2007 257/E21.122 |
| 6,194,239 | B1 * | 2/2001 | Tayanaka | H01L 21/02381 257/E21.102 |
| 6,344,375 | B1 * | 2/2002 | Orita | H01L 21/0237 257/E21.125 |
| 6,407,441 | B1 * | 6/2002 | Yuan | H01L 23/66 257/3 |
| 6,417,069 | B1 * | 7/2002 | Sakaguchi | H01L 21/76259 204/237 |
| 6,486,917 | B2 * | 11/2002 | Iwasaki | H01L 27/14601 348/294 |
| 6,534,382 | B1 * | 3/2003 | Sakaguchi | B28D 5/00 257/E21.088 |
| 6,593,211 | B2 | 7/2003 | Sato | |
| 6,602,760 | B2 * | 8/2003 | Poortmans | H01L 21/76259 257/E21.57 |
| 6,602,767 | B2 * | 8/2003 | Nishida | H01L 21/02032 257/E21.215 |
| 6,794,805 | B1 * | 9/2004 | Hatai | B82Y 10/00 313/309 |
| 6,881,650 | B2 | 4/2005 | Lee et al. | |
| 6,921,914 | B2 | 7/2005 | Cheng et al. | |
| 7,060,597 | B2 | 6/2006 | Kurita et al. | |
| 7,095,043 | B2 | 8/2006 | Oda et al. | |
| 7,125,458 | B2 | 10/2006 | Bedell et al. | |
| 7,157,352 | B2 * | 1/2007 | Yamanaka | H01L 27/14618 257/E21.6 |
| 7,327,036 | B2 * | 2/2008 | Borghs | H01L 21/02381 257/762 |
| 7,365,399 | B2 * | 4/2008 | de Souza | H01L 21/0203 257/368 |
| 7,410,883 | B2 * | 8/2008 | Gadkaree | H01L 21/76259 257/E21.122 |
| 7,420,201 | B2 * | 9/2008 | Langdo | H01L 21/28518 257/18 |
| 7,553,369 | B2 * | 6/2009 | Marty | B81C 1/0038 117/88 |
| 7,772,096 | B2 * | 8/2010 | DeSouza | H01L 21/76245 257/E21.09 |
| 7,833,884 | B2 * | 11/2010 | Bedell | H01L 21/02126 438/479 |
| 7,928,436 | B2 | 4/2011 | Cheng et al. | |
| 8,157,978 | B2 * | 4/2012 | Sendelbach | C25F 3/12 204/224 R |
| 8,304,810 | B2 | 11/2012 | Sugii et al. | |
| 8,722,526 | B2 * | 5/2014 | Lee | C30B 25/183 117/89 |
| 8,791,502 | B2 | 7/2014 | Wang | |
| 8,815,618 | B2 * | 8/2014 | Chen | H01L 33/0079 257/100 |
| 9,012,253 | B2 * | 4/2015 | Lochtefeld | C30B 29/06 257/190 |
| 9,093,271 | B2 * | 7/2015 | Schenk | H01L 21/02381 |
| 9,198,294 | B2 * | 11/2015 | Landru | H01L 21/76254 |
| 9,224,904 | B1 * | 12/2015 | Kumar | H01L 31/1804 |
| 2003/0205480 | A1 * | 11/2003 | Sakaguchi | C25D 11/32 205/159 |
| 2008/0171424 | A1 * | 7/2008 | Li | H01L 21/02381 438/496 |
| 2009/0217967 | A1 * | 9/2009 | Hovel | B82Y 20/00 136/249 |
| 2011/0057295 | A1 * | 3/2011 | Plossl | C30B 25/18 257/615 |
| 2013/0000715 | A1 * | 1/2013 | Moslehi | H01L 31/022441 136/256 |
| 2013/0337601 | A1 * | 12/2013 | Kapur | H01L 31/06875 438/93 |
| 2015/0270120 | A1 * | 9/2015 | Wang | H01L 21/0262 438/503 |
| 2016/0190302 | A1 * | 6/2016 | Bedell | H01L 29/785 257/347 |

OTHER PUBLICATIONS

Unagami, "Formation Mechanism of Porous Silicon Layer by Anodization in HF Solution", Journal of Electrochemical Society: Solid-State Science and Technology 127 (1980) pp. 476-483.*

Zhang et al., "Porous Silicon Formation and Electropolishing of Silicon by Anodic Polarization in HF Solution", Journal of Electrochemical Society 136 (1989) pp. 1561-1565.*

Matoussi et al., "Porous silicon as an intermediate buffer layer for GaN growth on (100) Si", Microelectronics Journal 32 (2001) pp. 995-998.*

Boufaden et al., "GaN growth on porous silicon by MOVPE", Microelectronics Journal 34 (2003) pp. 843-848.*

Christophersen et al., "Crystal orientation and electrolyte dependence for macropore nucleation and stable growth on p-type Si", Materials Science and Engineering B69-70 (2000) pp. 194-198.*

Matoussi et al., "Luminescent properties of GaN films grown on porous silicon substrate", Journal of Luminescence 130 (2010) pp. 399-403.*

Pending U.S. Appl. No. 14/585,742, entitled: "SOI Based FINFET With Strained Source-Drain Regions", filed Dec. 30, 2014.

* cited by examiner

US 10,032,870 B2

LOW DEFECT III-V SEMICONDUCTOR TEMPLATE ON POROUS SILICON

BACKGROUND

The present invention generally relates to semiconductor device manufacturing, and more particularly to the formation of a III-V semiconductor on a porous silicon structure.

The increasing operating speeds and computing power of microelectronic devices have recently given rise to the need for an increase in the complexity and functionality of the semiconductor structures from which that these devices are fabricated. Hetero-integration of dissimilar semiconductor materials, for example, III/V materials, such as gallium arsenide, gallium nitride, indium aluminum arsenide, and/or germanium with silicon or silicon-germanium substrate, is an attractive path to increasing the functionality and performance of the CMOS platform. In particular, heteroepitaxial growth can be used to fabricate many modern semiconductor devices where lattice-matched substrates are not commercially available or to potentially achieve monolithic integration with silicon microelectronics. Performance and, ultimately, the utility of devices fabricated using a combination of dissimilar semiconductor materials, however, depends on the quality of the resulting structure. Specifically, a low level of dislocation defects is important in a wide variety of semiconductor devices and processes, because dislocation defects partition an otherwise monolithic crystal structure and introduce unwanted and abrupt changes in electrical and optical properties, which, in turn, results in poor material quality and limited performance. In addition, the threading dislocation segments can degrade physical properties of the device material and can lead to premature device failure.

Dislocation defects typically arise in efforts to epitaxially grow one kind of crystalline material on a substrate of a different kind of material, often referred to as "heterostructure," due to different crystalline lattice sizes of the two materials. This lattice mismatch between the starting substrate and subsequent layer(s) creates stress during material deposition that generates dislocation defects in the semiconductor structure.

SUMMARY

According to one embodiment of the present invention, a method is provided. The method may include forming a stack of layers including a first semiconductor layer on a substrate, a second semiconductor layer on the first semiconductor layer, and a third semiconductor layer on the second semiconductor layer; converting the second semiconductor layer into a porous semiconductor layer using a porousification process; and forming a fourth semiconductor layer on the third semiconductor layer, wherein the fourth semiconductor layer is relaxed, the third semiconductor layer is strained, and the porous semiconductor layer is partially strained.

According to another embodiment of the present invention, a method is provided. The method may include forming a stack of layer, the stack of layers includes a base silicon layer on a substrate, a thick silicon layer on the base silicon layer, a thin silicon layer on the thick silicon layer, wherein the thin silicon layer is thinner than the thick silicon layer, the thick silicon layer is relaxed, and the thin silicon layer is relaxed; converting the thick silicon layer into a porous silicon layer using a porousification process; and forming a III-V layer on the thin silicon layer, wherein the III-V layer is relaxed, the thin silicon layer is strained, and the porous silicon layer is partially strained.

According to another embodiment of the present invention, a structure is provided. The structure may include a stack of layers including a base silicon layer on a substrate, a thick silicon layer on the base silicon layer, and a thin silicon layer on the thick silicon layer, wherein the thin silicon layer is thinner than the thick silicon layer; and a III-V layer directly on the thin silicon layer, wherein the III-V layer is relaxed, the thin silicon layer is strained, and the thick silicon layer is partially strained.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
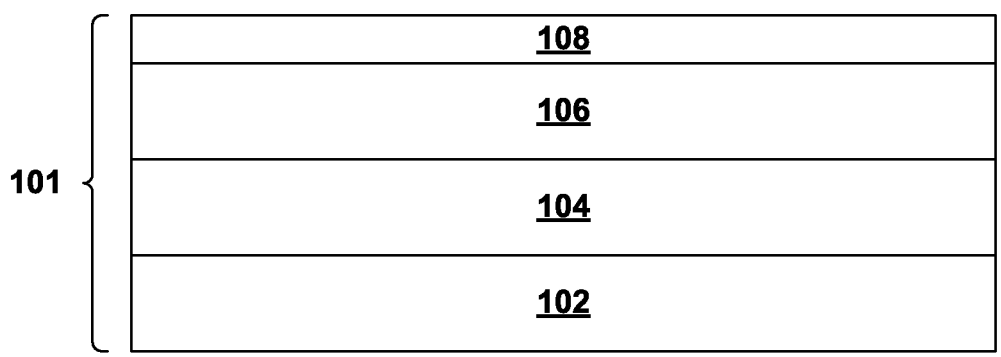
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of a porous silicon structure. Ideally, it may be desirable to fabricate a III-V semiconductor on a silicon layer without defects due to a lattice mismatch. One way to fabricate a III-V semiconductor on a silicon substrate is to use a porous silicon structure to elastically compensate for the lattice mismatch between a substrate and a III-V semiconductor. One embodiment by which to form a III-V semiconductor on a porous silicon structure is described in detail below referring to the accompanying drawings FIGS. 1-5.

With reference to FIG. 1, a demonstrative illustration of a structure 100 is provided during an intermediate step of a method of fabricating a semiconductor layer on a porous silicon structure according to an embodiment. More specifically, the method can start by forming a stack 101.

The stack 101 may include (from bottom to top) a substrate 102, a first semiconductor layer 104, a second semiconductor layer 106, and a third semiconductor layer 108. The stack 101 may be formed in a similar fashion to a typical semiconductor-on-insulator (SOI); however, the stack 101 may subsequently include a porous layer with the ability to act as a stress compensator for any lattice mismatch between varying materials.

The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. In an embodiment, the substrate 102 is highly p-doped silicon having a <100> crystallographic orientation.

The first semiconductor layer 104 may be formed on the substrate 102 using any deposition technique known in the art, such as, for example, epitaxial growth, chemical vapor deposition (CVD), physical vapor deposition (PVD), or atomic layer deposition (ALD). The first semiconductor layer 104 can be any semiconductor material known in the art, such as, for example, silicon or SiGe. In an embodiment, the first semiconductor layer 104 is silicon with a boron dopant concentration of about 2E18 $cm^{-3}$ (i.e., $2 \times 10^{18}$ atoms per centimeter cubed) and a thickness of about 1000 Å. In this embodiment, the first semiconductor layer 104 may be referred to as having a "low doping concentration" relative to subsequently formed layers. It should be noted, the first semiconductor layer 104 may be referred to as a base semiconductor layer or a base silicon layer.

The second semiconductor layer 106 may be formed on the first semiconductor layer 104 using any deposition technique known in the art, such as, for example, epitaxial growth, chemical vapor deposition (CVD), physical vapor deposition (PVD), or atomic layer deposition (ALD). The second semiconductor layer 106 can be any semiconductor material known in the art, such as, for example, silicon or SiGe. The second semiconductor layer 106 may have a thickness ranging from about 100 nm to about 200 nm; however, other thicknesses may be used. In an embodiment, the second semiconductor layer 106 is a thick silicon layer grown on the first semiconductor layer 104 using epitaxy, where the second semiconductor layer 106 has a boron dopant concentration of about 2E20 $cm^{-3}$ (i.e., $2 \times 10^{20}$ atoms per centimeter cubed) and a thickness of about 150 nm. In this embodiment, the second semiconductor layer 106 may be referred to as "highly doped" relative to other layers, such as, for example, the first semiconductor layer 104. The high doping of the second semiconductor layer 106 may help with porousification performed in subsequent steps, both with forming the pores and with making the pores relatively large. It should be noted, the second semiconductor layer 106 may be referred to as a relaxed second semiconductor layer or a thick semiconductor layer.

The third semiconductor layer 108 may be formed on the second semiconductor layer 106 using any deposition technique known in the art, such as, for example, epitaxial growth, chemical vapor deposition (CVD), physical vapor deposition (PVD), or atomic layer deposition (ALD). The third semiconductor layer 108 can be any semiconductor material known in the art, such as, for example, silicon or SiGe. The third semiconductor layer 108 may have a thickness ranging from about 10 nm to about 50 nm; however, other thicknesses may be used. The third semiconductor layer 108 may be formed on the second semiconductor layer 106 before the second semiconductor layer 106 undergoes the above mentioned porousification step (described in detail below with reference to FIG. 2). In an embodiment, the third semiconductor layer 108 is a thin silicon layer grown on the second semiconductor layer 106 using epitaxy, where the third semiconductor layer 108 has a boron dopant concentration of about 2E18 $cm^{-3}$ (i.e., $2 \times 10^{18}$ atoms per centimeter cubed). In this embodiment, the third semiconductor layer 108 may be referred to as having a "low doping concentration" relative to other layers, such as, for example, the second semiconductor layer 106. It should be noted, the third semiconductor layer 108 may be referred to as a relaxed third semiconductor layer or a thin semiconductor layer.

Figure 2:
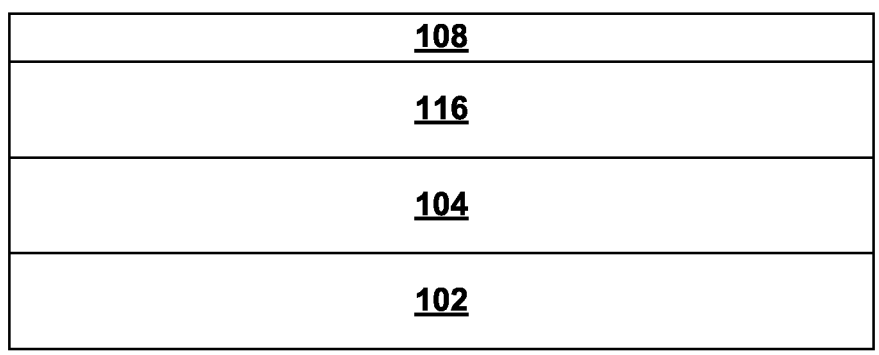
FIG. 2 is a cross section view of the semiconductor structure and illustrates the conversion of a second semiconductor layer to a porous semiconductor layer, according to an exemplary embodiment.

With reference to FIG. 2, a demonstrative illustration of the structure 100 is provided during an intermediate step of a method of fabricating a semiconductor layer on a porous silicon structure according to an embodiment. More specifically, the method can include converting the second semiconductor layer 106 into a porous semiconductor layer 116.

The second semiconductor layer 106 may be converted into the porous semiconductor layer 116 using any porousification technique know in the art, such as, for example, anodization. In an anodization process, the structure 100 may be immersed into a hydrofluoric fluoride (HF) bath while applying an electrical bias to the structure 100, where the HF bath reacts with the second semiconductor layer 106 (e.g., because of the highly doped material of the second semiconductor layer 106) forming pores in the second semiconductor layer 106 and converting the second semiconductor layer 106 into the porous semiconductor layer 116. One benefit of having the third semiconductor layer 108 may include providing a uniform current flow during the anodization process due to the low doping concentration.

In general, the HF anodization converts p-doped single crystal silicon into porous silicon. The rate of formation and the nature of the porous silicon so-formed (porosity and microstructure) is determined by both the material properties (i.e., doping type and concentration) as well as the reaction conditions of the anodization process itself (current density, bias, illumination and additives in the HF-containing solution). More specifically, the porous silicon forms with greatly increased efficiency in the higher doped regions and therefore, the second semiconductor layer 106 is efficiently converted into the porous semiconductor layer 116.

The term "HF-containing solution" or "HF bath" may include concentrated HF (49%), a mixture of HF and water, a mixture of HF and a monohydric alcohol such as methanol, ethanol, propanol, etc, or HF mixed with at least one surfactant. The amount of surfactant that is present in the HF solution is typically from about 1% to about 50%, based on 49% HF.

In this embodiment, the porousification process is followed up with a conventional hydrogen ($H_2$) anneal process that: (i) removes the light boron doping in the third semiconductor layer 108; (ii) closes small pores in the third semiconductor layer 108; and (iii) does not affect the relatively large pores formed in porous semiconductor layer 116.

Figure 3:
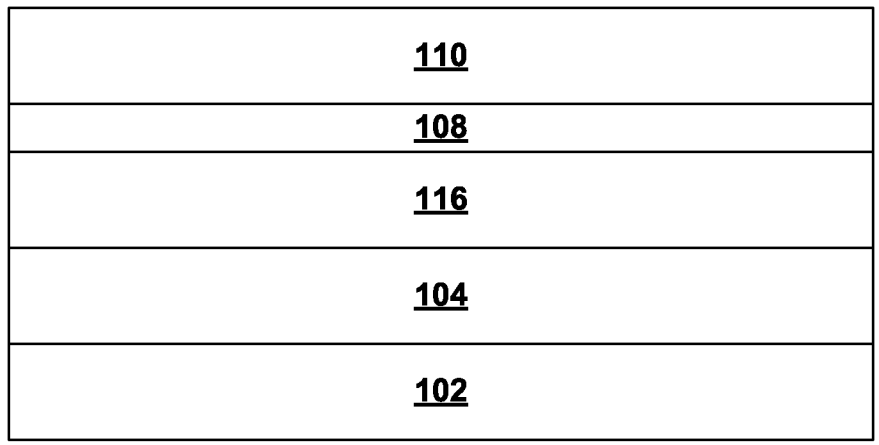
FIG. 3 is a cross section view of the semiconductor structure and illustrates the formation of a fourth semiconductor layer on a thin third semiconductor layer, where the third semiconductor layer is on the porous semiconductor layer, according to an exemplary embodiment.

With reference to FIG. 3, a demonstrative illustration of the structure 100 is provided during an intermediate step of a method of fabricating a semiconductor layer on a porous silicon structure according to an embodiment. More specifically, the method can include forming a forth semiconductor layer 110 on the third semiconductor layer 108.

The forth semiconductor layer 110 may be formed on the third semiconductor layer 108 using any deposition technique known in the art, such as, for example, epitaxial growth, chemical vapor deposition (CVD), physical vapor deposition (PVD), or atomic layer deposition (ALD). The forth semiconductor layer 110 may have a thickness ranging from about 500 nm to about 1 µm; however, other thicknesses may be used. In an embodiment, the forth semiconductor layer 110 is a III-V semiconductor with a thickness of about 100 nm.

Typically, when a III-V semiconductor is grown on a silicon seed layer, the III-V semiconductor may be forced to match the lattice structure of the seed layer because of the large lattice mismatch between silicon (5.4 Å) and III-V semiconductor (5.6 Å-6.4 Å). Therefore, the III-V semiconductor may be under stress and misfit dislocations or defects may form between the seed layer and a critical thickness of the III-V semiconductor, at which time the III-V semiconductor may relax. However, in the exemplary embodiment, the porous semiconductor layer 116 may be soft and may accommodate the high lattice mismatch between the fourth semiconductor layer 110 (e.g., a III-V semiconductor) and the third semiconductor layer 108 (e.g., a silicon seed layer). The porous semiconductor layer 116 may compensate for stress due to the lattice mismatch because the third semiconductor layer 108 (on top of the porous semiconductor layer 116) may have a relatively thin thickness. The thin third semiconductor layer 108 may stretch to match the lattice structure of the fourth semiconductor layer 110, where the porous semiconductor layer 116 can allow for stretching of the third semiconductor layer 108 because of the porous characteristics described above. The fourth semiconductor layer 110 may be formed in a relaxed state (e.g., low defects) because of the stress consumed by the third semiconductor layer 108 facilitated by the porous semiconductor layer 116.

One benefit of forming a III-V semiconductor having low defects on silicon may allow for co-integration of a separate pFET device grown in an adjacent region on the same silicon seed layer. For example, a separate pFET device can be a silicon fin formed on the same silicon seed layer (i.e., the third semiconductor layer 108) and adjacent to the fourth semiconductor layer 110, such that the similar lattice structure will not stretch the third semiconductor layer 108 beneath the silicon fin.

Figure 4:
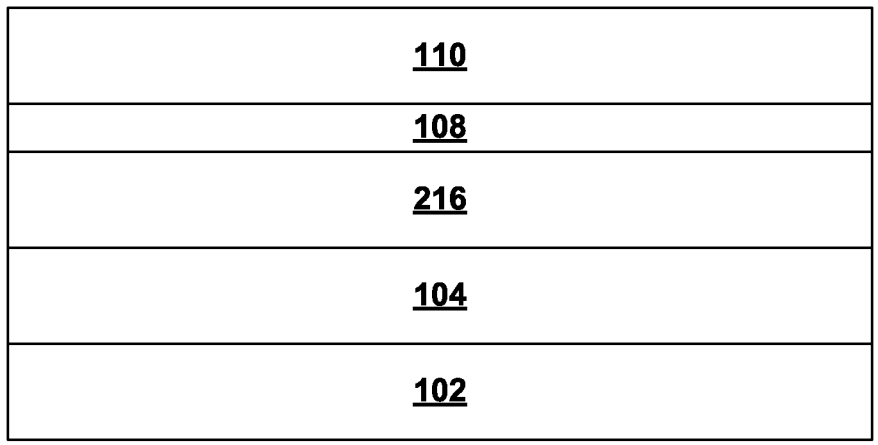
FIG. 4 is a cross section view of an alternative semiconductor structure and illustrates the conversion of the porous semiconductor layer into a buried oxide (BOX) layer, according to an alternative embodiment.

With reference to FIG. 4, a demonstrative illustration of a structure 200 is provided during an intermediate step of a method of fabricating a semiconductor layer on a porous silicon structure according to an alternative embodiment. The structure 200 may be substantially similar in all respect to the structure 100, described above, and undergo additional processing. More specifically, the method can further include converting the porous semiconductor layer 116 into a buried oxide (BOX) layer 216.

The porous semiconductor layer 116 may be converted into the BOX layer 216 using any oxidation technique known in the art, such as, for example, dry oxidation. The oxidation may convert the porous semiconductor layer 116 only because of the porous characteristics described above. Thermal oxidation may be performed in a dry oxidizing ambient atmosphere and at a temperature ranging from about 750° C. to about 1100° C. to convert the porous layer 116 into the BOX layer 216. In an embodiment, the structure 200 may include the fourth semiconductor layer 110 on the third semiconductor layer 108, where the third semiconductor layer 108 is on the BOX layer 216.

Figure 5:
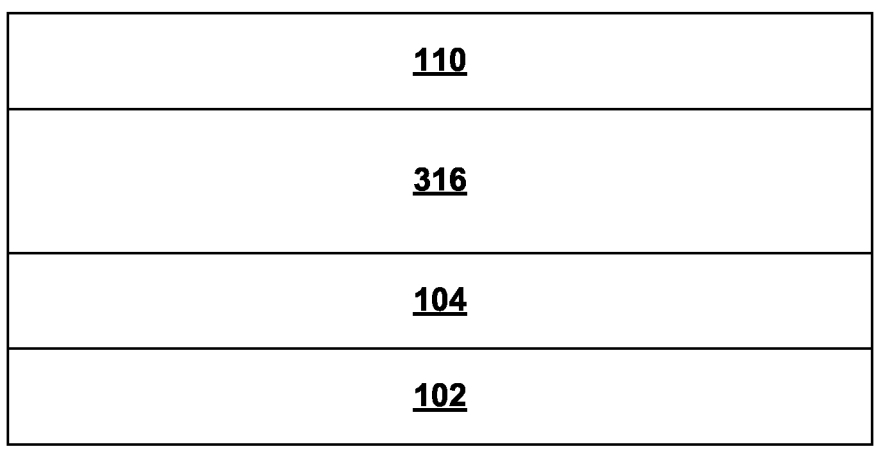
FIG. 5 is a cross section view of an alternative semiconductor structure and illustrates the conversion of the porous semiconductor layer and the third semiconductor layer into an alternative buried oxide (BOX) layer, according to an alternative embodiment.

With reference to FIG. 5, a demonstrative illustration of a structure 300 is provided during an intermediate step of a method of fabricating a semiconductor layer on a porous silicon structure according to an embodiment. The structure 300 may be substantially similar in all respect to the structure 100, described above, and undergo additional processing. More specifically, the method can include converting both the porous semiconductor layer 116 and the third semiconductor layer 108 into a buried oxide layer (BOX) 316.

The porous semiconductor layer 116 and the third semiconductor layer 108 may both be converted into the BOX layer 316 using any oxidation technique known in the art, such as, for example, dry oxidation. In an embodiment, the alternative structure 300 may include the fourth semiconductor layer 110 directly on the BOX layer 316.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of forming a semiconductor on a porous semiconductor comprising:
    forming a stack of layers including a first semiconductor layer on a substrate, a second semiconductor layer on the first semiconductor layer, and a third semiconductor layer on the second semiconductor layer, wherein a concentration of dopants within the second semiconductor layer is greater than a concentration of dopants in the first and third semiconductor layers;
    converting the second semiconductor layer into a porous semiconductor layer using a porousification process;
    annealing the third semiconductor layer; and
    forming a fourth semiconductor layer on the third semiconductor layer,
    wherein the fourth semiconductor layer is relaxed, the third semiconductor layer is strained, and the porous semiconductor layer is partially strained,
    wherein the third semiconductor layer is thinner than the second semiconductor layer, and
    wherein the fourth semiconductor layer is directly on the third semiconductor layer and the third semiconductor layer is directly on the second semiconductor layer.

2. The method of claim 1, wherein the second semiconductor layer is silicon with a boron concentration of 2E20 atoms per centimeter cubed.

3. The method of claim 1, wherein the third semiconductor layer is thinner than the fourth semiconductor layer.

4. The method of claim 1, wherein the fourth semiconductor layer is a III-V semiconductor.

5. The method of claim 1, wherein the porousification process includes:
    exposing the second semiconductor layer to a hydrofluoric fluoride (HF) bath and
    applying an electrical bias to each layer of the stack of layers, the HF bath reacting with the dopants in each semiconductor layer such that the concentration of dopants in the second semiconductor layer relative to the first and third semiconductor layers causes the second semiconductor layer to be converted into the porous semiconductor layer,
    wherein the annealing of the third semiconductor layer reduces dopants and pores therefrom, the porous semiconductor layer remaining porous during the annealing.

6. The method of claim 1, wherein the concentration of dopants within the second semiconductor layer is substantially uniform, the concentration of dopants within the first semiconductor layer is substantially uniform, and the concentration of dopants within the third semiconductor layer is substantially uniform.

7. A method of forming a semiconductor on a porous semiconductor comprising:
    forming a stack of layers, the stack of layers including a base silicon layer on a substrate, a thick silicon layer on the base silicon layer, and a thin silicon layer on the thick silicon layer, wherein the thin silicon layer is thinner than the thick silicon layer, the thick silicon layer is relaxed, and the thin silicon layer is relaxed, and wherein a concentration of dopants within the thick silicon layer is greater than a concentration of dopants in the base and thin silicon layers;
    converting the thick silicon layer into a porous silicon layer using a porousification process;
    annealing the thin silicon layer; and
    forming a III-V layer on the thin silicon layer, wherein the III-V layer is relaxed, the thin silicon layer is strained, and the porous silicon layer is partially strained;
    wherein the III-V layer is directly on the thin silicon layer and the thin silicon layer is directly on the thick silicon layer.

8. The method of claim 7, wherein the thin silicon layer has a thickness between 10 nm and 50 nm.

9. The method of claim 7, wherein the thick silicon layer has a thickness between 100 nm and 200 nm.

10. The method of claim 7, wherein the thick silicon layer has a boron concentration of 2E20 atoms per centimeter cubed, the thin silicon layer has a boron concentration of 2E18 atoms per centimeter cubed.

11. The method of claim 7, wherein the porousification process includes:
    immersing the stack of layers in a hydrofluoric fluoride (HF) bath; and
    applying an electrical bias to each layer of the stack of layers, the HF bath reacting with the dopants in each silicon layer such that the concentration of dopants in the thick silicon layer relative to the base and thin silicon layer causes the thick silicon layer to be converted into the porous silicon layer,
    wherein the annealing of the thin silicon layer reduces dopants and pores therefrom, the porous silicon layer remaining porous during the annealing.

12. The method of claim 7, wherein the concentration of dopants within the thick silicon layer is substantially uniform, the concentration of dopants within the base silicon layer is substantially uniform, and the concentration of dopants within the thin silicon layer is substantially uniform.

* * * * *